(12) United States Patent
Yoshioka et al.

(10) Patent No.: US 6,255,672 B1
(45) Date of Patent: Jul. 3, 2001

(54) SEMICONDUCTOR DEVICE

(75) Inventors: Shimpei Yoshioka; Yasuhito Saito, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/199,780

(22) Filed: Nov. 25, 1998

(30) Foreign Application Priority Data

Nov. 26, 1997 (JP) ................................. 9-324424
Jul. 31, 1998 (JP) ................................. 10-217049

(51) Int. Cl.[7] ................................. H01L 21/332
(52) U.S. Cl. .................... 257/107; 257/133; 257/138; 257/142
(58) Field of Search .................... 257/107, 133, 257/142, 138, 499, 565, 262

(56) References Cited

U.S. PATENT DOCUMENTS 5,828,100  * 10/1998  Tamba et al. .

FOREIGN PATENT DOCUMENTS 33 22 593   1/1985   (DE) .
9-64258     3/1997   (JP) .

OTHER PUBLICATIONS

Patent Abstracts of Japan, vol. 018, No. 686(C–1292), Dec. 26, 1994, JP 06 272147, Sep. 27, 1994.

* cited by examiner

*Primary Examiner*—Kevin M. Picardat
*Assistant Examiner*—D. M. Collins
(74) *Attorney, Agent, or Firm*—Oblon, Spivak, McClelland, Maier & Neustadt, P.C.

(57) ABSTRACT

A semiconductor device includes a pair of semiconductor switching elements and a board. Each semiconductor switching element has positive and control electrodes formed on one surface and a negative electrode formed on the other surface. The positive and control electrodes of one of the semiconductor switching elements are joined to the board, and the negative electrode of the other semiconductor switching element, which faces in a direction opposite to that of one of the semiconductor switching elements, is joined to the board.

6 Claims, 3 Drawing Sheets

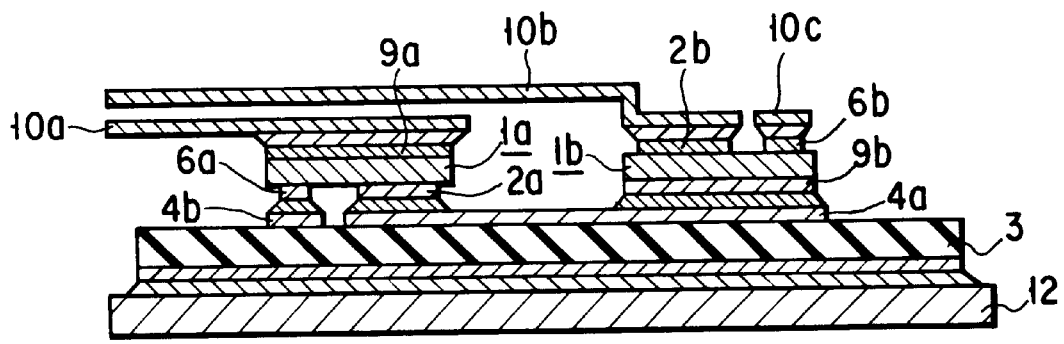
F I G. 4

SEMICONDUCTOR DEVICE

BACKGROUND OF THE INVENTION

The present invention relates to a semiconductor device having a switching element and, more particularly, to a semiconductor device having an improved mounting structure for thyristors, power transistors, and the like used in the field of power electronics.

Recently, in the field of power electronics control for industrial pumps, fans, and the like, efforts have been made to effectively use energy by using inverter devices. The major portion of such an inverter device is made of a semiconductor switching element for switching currents.

As semiconductor switching elements, thyristors, power transistors, and the like have been often used. Recently, a GTO (Gate Turn-off Thyristor), an IGBT (Insulated Gate Bipolar Transistor), an IEGT (Injection Enhanced Gate Transistor), and the like have been widely used.

Each of these semiconductor switching elements includes three electrodes, namely a positive (emitter) electrode, a negative (collector) electrode, and a control (gate) electrode, which are named differently depending on the types, and performs switching operation by controlling currents and voltages through the control electrode.

When these elements are mounted in a package, the positive and negative electrodes generate a considerable amount of heat because of the flow of large currents therein and switching operation. Careful consideration must therefore be given to current capacity and a heat dissipation structure. Since no large current flows in the control gate, no special heat dissipation measures are required for it.

In many cases, a plurality of semiconductor switching elements are simultaneously used depending on control targets.

FIG. 1 is a sectional side view of a conventional semiconductor device having a plurality (one pair in FIG. 1) of IGBTs (or IEGTs) as semiconductor switching elements mounted side by side on a board.

Two IGBTs 1a and 1b respectively have emitter electrodes 2a and 2b formed on their surfaces. The emitter electrodes 2a and 2b are respectively connected to wirings 10a and 10b by soldering.

Gate electrodes 6a and 6b are formed on the end faces of the upper surfaces of the IGBTs 1a and 1b. The gate electrodes 6a and 6b are respectively connected to wirings 10c and 10d by soldering.

Collector electrodes 9a and 9b are formed on the lower surfaces of the IGBTs 1a and 1b. The collector electrodes 9a and 9b are respectively connected to surface copper patterns 14a and 14b on a DBC (copper-clad ceramic) board 3 by soldering.

The electrodes 2a, 2b, 6a, and 6b on the upper surfaces of the IGBTs 1a and 1b and the electrodes 9a and 9b on the lower surfaces are metallized to allow soldering.

Note that a metallization method is not limited to a specific one, and a method of forming a metal layer on the surface of an aluminum electrode using titanium, platinum, gold, or palladium, a method of coating an aluminum electrode with nickel or the like, is properly used. A heat sink 12 is soldered to the lower surface of the board.

In this structure, the emitter electrode 2a on the IGBT 1a is electrically connected to the collector electrode 9b on the IGBT 1b through the wiring 10a and the surface copper pattern 14b.

FIG. 2 is a sectional side view of another conventional semiconductor device having a plurality (one pair in FIG. 2) of IGBTs mounted on a board.

Two IGBTs 1a and 1b respectively have emitter electrodes 2a and 2b formed on their lower surfaces. The emitter electrodes 2a and 2b are respectively connected to surface copper patterns 14a and 14b on a DBC (copper-clad ceramic) board 3 by soldering.

Gate electrodes 6a and 6b are formed on the end faces of the upper surfaces of the IGBT3 1a and 1b. The gate electrodes 6a and 6b are respectively connected to surface copper patterns 7a and 7b on the DBC board 3 by soldering.

Collector electrodes 9a and 9b are also formed on the lower surfaces of the IGBTs 1a and 1b. The collector electrodes 9a and 9b are respectively connected to wirings 10d and 10c by soldering.

The electrodes 2a, 2b, 6a, 6b, 9a, and 9b on the upper and lower surfaces of the IGBTs 1a and 1b are metallized to allow soldering as in the case shown in FIG. 1. Similarly, a heat sink 12 is also soldered to the lower surface of the board 3.

In this structure, the emitter electrode 2b on the IGBT 1b is electrically connected to the collector electrode 9a on the IGBT 1a through the wiring 10d and the surface copper pattern 14b.

In each of the conventional mounting structures shown in FIGS. 1 and 2, each connection member has a connect portion perpendicular to the board 3. Therefore, a large inductance component is produced by each connect portion that is perpendicular to the board 3.

In addition, since connection members such as the wirings 10a and 10d must be arranged between two chips, the size of the package becomes large.

If wirings are routed in a complicated manner to reduce a size of the package, connection members need not necessarily be arranged between two chips. In consideration of wiring resistances and inductances as electric circuit characteristics, however, it is inadvisable to route the interconnections in a complicated manner.

BRIEF SUMMARY OF THE INVENTION

The present invention has been made in consideration of the above situation, and has as its object to provide a semiconductor device which can omit wirings as connection members, which are perpendicular to a board by mounting a pair of semiconductor switching elements such that the upper side of one element faces in a direction opposite to that of the other element, thereby preventing increases in inductance and wiring resistance.

In order to achieve the above object, according to the present invention, there is provided a semiconductor device comprising:

a pair of semiconductor switching elements, each of the semiconductor switching elements having a positive electrode and control electrode formed on one surface and a negative electrode formed on the other surface; and a board to which the positive and control electrodes of one of the semiconductor switching elements are joined and the negative electrode of the other semiconductor switching element facing in a direction opposite to that of one semiconductor switching element is joined.

With the above arrangement, according to the semiconductor device of the present invention, since the plurality of semiconductor switching elements are mounted on the land of the board in opposite directions, the components of the connect members which are perpendicular to the board can be omitted, thereby preventing increases in inductance and wiring resistance.

In addition, since any connect members or wirings need not be arranged between the two semiconductor switching elements, the distance between the semiconductor switching elements can be reduced, thereby reducing the package size.

The use of the conductors as connect members which are formed by weaving thin conducting wires allows a reduction in the rigidity of each electrode and hence can reduce thermal stress in each electrode, thereby preventing the element joint portions and the like from being damaged by fatigue while maintaining the advantages of a flat wiring structure with a low wiring inductance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a sectional view taken along a line IV—IV of the semiconductor device in FIG. 3;

DETAILED DESCRIPTION OF THE INVENTION

The embodiments of the present invention will be described below with reference to the views of the accompanying drawing.

Figure 3:
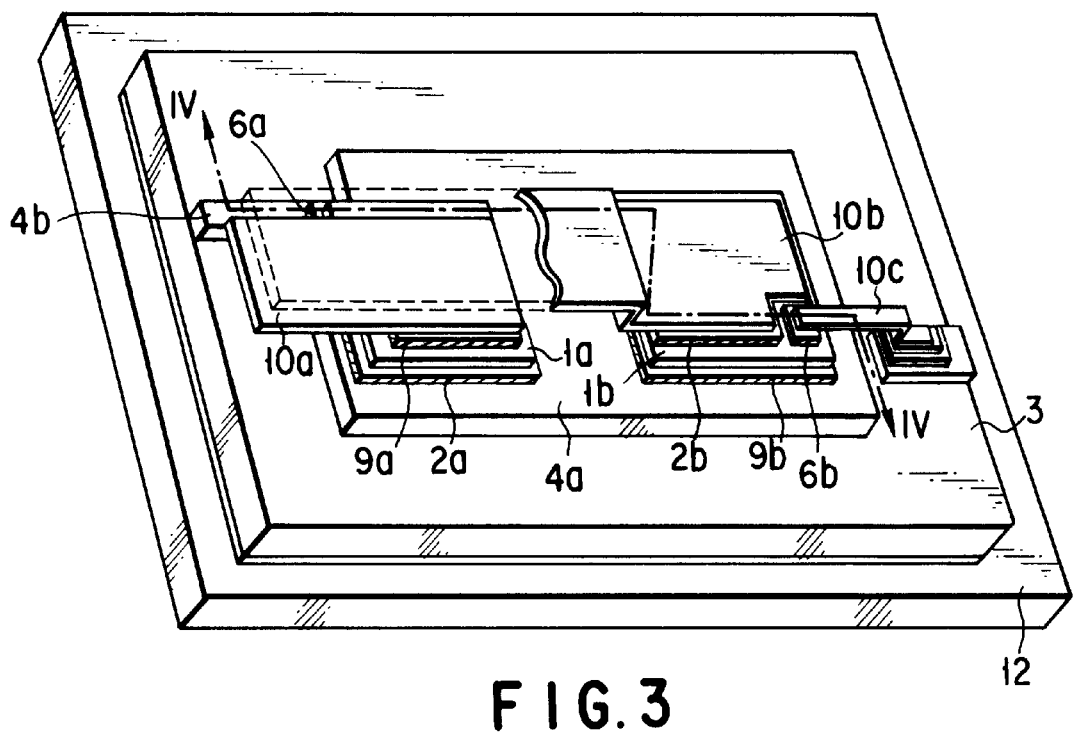
FIG. 3 is a perspective view showing a semiconductor device according to an embodiment of the present invention.

FIG. 3 is a perspective view of a structure in which IGBTs (or IEGTS) as a pair of semiconductor switching elements, which constitute a semiconductor device of the first embodiment of the present invention, are mounted side by side on a board. FIG. 4 is a sectional view taken along a line IV—IV of the semiconductor device in FIG. 3. This device will be described with reference to FIGS. 3 and 4.

First and second IGBTs 1a and 1b are mounted on a land 4a on a DBC (copper-clad ceramic) board 3 in opposite directions.

An emitter electrode 2a formed on the lower surface of the first IGBT 1a is soldered to the land 4a of the DBC board 3. An emitter electrode 2b on the upper surface of the second IGBT 1b is soldered to a wiring 10b.

A gate electrode 6a is formed on the end face of the lower surface of the first IGBT 1a. A gate electrode 6b is formed on the end face of the upper surface of the second IGBT 1b. The gate electrode 6a on the first IGBT 1a is soldered to a land 4b of the DBC board 3. The gate electrode 6b on the second IGBT 1b is connected to a wiring 10c by soldering.

Collector electrodes 9a and 9b are respectively formed on the upper surface of the first IGBT 1a and the lower surface of the second IGBT 1b. The collector electrode 9a on the first IGBT 1a is connected to a wiring 10a by soldering. The collector electrode 9b on the second IGBT 1b is soldered to the land 4a of the DBC board 3.

Figure 1:
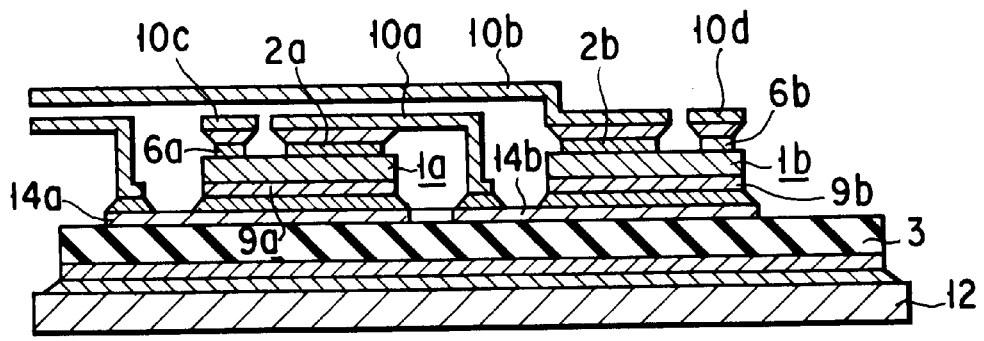
FIG. 1 is a sectional view of the main part of an example of the mounting structure of a conventional semiconductor device.
Figure 2:
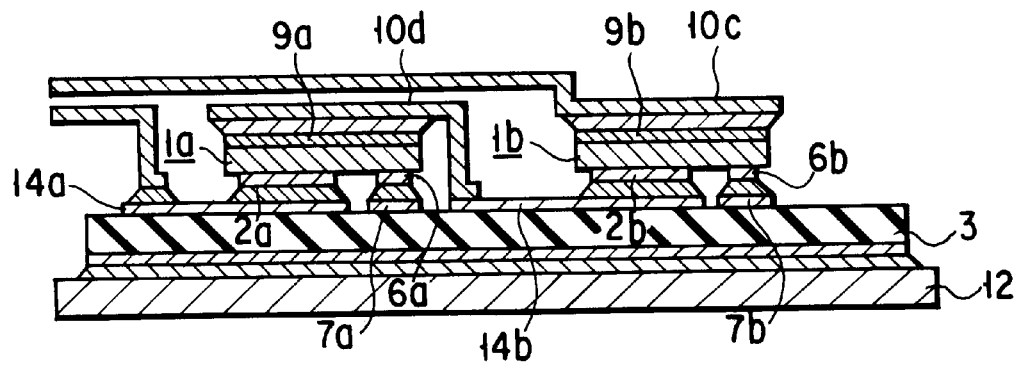
FIG. 2 is a sectional view of the main part of another example of the mounting structure of a conventional semiconductor device.

That is, the emitter electrode 2a of the first IGBT 1a is electrically connected to the collector electrode 9b of the second IGBT 1b through the land 4a of the DBC board 3. With this structure, in the first embodiment, the L-shaped wirings 10a and 10d having vertical components with respect to the board 3 as in the conventional structures shown in FIGS. 1 and 2 can be omitted.

Obviously, no problem arises even if the first and second IGBTs 1a and 1b are mounted in the reverse directions to those shown in FIGS. 3 and 4.

Figure 5:
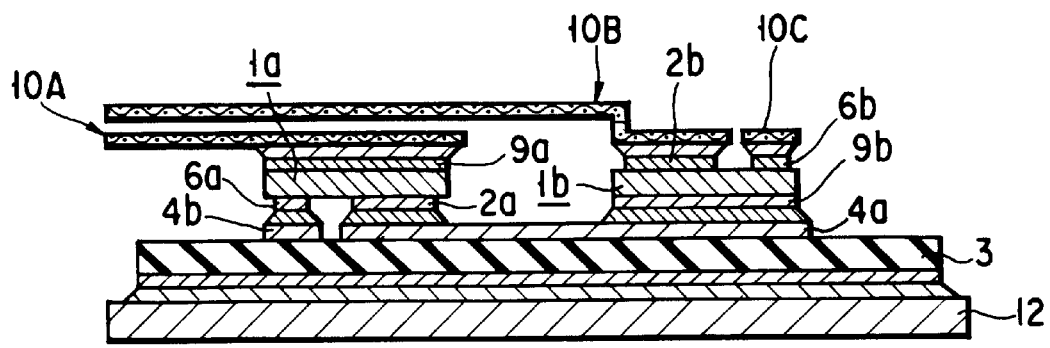
FIG. 5 is a sectional view showing a semiconductor device according to another embodiment of the present invention.

FIG. 5 shows the second embodiment of the present invention. The same reference numerals in FIG. 5 denote the same parts as in FIG. 4, and a description thereof will be omitted.

In the first embodiment shown in FIG. 4, the wirings 10a, 10b, and 10c are formed by using a general connection material. In contrast to this, the second embodiment shown in FIG. 5 uses wirings 10A, 10B, and 10C each formed by weaving thin conducting wires.

According to the mounting structures of the first and second embodiments, since the emitter electrode 2a of the first IGBT 1a is electrically connected to the collector electrode 9b of the second IGBT 1b through the land 4a, no connection members having components perpendicular to the board 3 are required. This can prevent increases in inductance and wiring resistance due to wirings perpendicular to the DBC board 3.

In addition, since the wirings 10a and 10b used in the prior art need not be arranged between the two IGBTs 1a and 1b as semiconductor switching elements, the distance between the semiconductor switching elements can be reduced. This makes the mounting structure more compact. In the mounting structure of the second embodiment, in particular, the use of the conductors which are formed by weaving thin conducting wires can reduce thermal stress in each electrode by reducing its rigidity and prevent elements and the joint portions and the like between the elements from being damaged by fatigue while maintaining the advantages of a flat wiring structure with a low wiring inductance.

Note that electrodes 2a and 6a on the lower surface of the IGBT 1a, an electrode 9a on the upper surface of the IGBT 1a, electrodes 2b and 6b on the upper surface of the IGBT 1b, and an electrode 9b on the lower surface of the IGBT 1b are preferably metallized to allow soldering. Note that a metallization method is not limited to a specific one, and a method of forming a metal layer on the surface of an aluminum electrode using titanium, platinum, gold, or palladium, a method of coating an aluminum electrode with nickel or the like, is properly used. In each of the mounting structures of the first and second embodiment, a heat sink 12 is soldered to the lower surface of the board 3.

The board 3 preferably has excellent heat dissipation properties to dissipate the heat generated by the semiconductor elements. For this reason, a so-called metal core board is used, which is obtained by forming an insulating layer made of epoxy, polybutadiene, polyimide, or the like on a metal base made of aluminum, invar, iron, or the like, and forming a wiring pattern on the insulating layer using a copper foil or the like.

A board obtained by forming wirings made of a metal such as copper or aluminum on the upper surface of a board made of a ceramic material such as alumina or aluminum nitride can be suitably used.

In a field demanding high dielectric strength, the DBC (copper-clad ceramic) board 3 obtained by directly bonding a copper foil to, for example, an alumina or aluminum nitride base can be suitably used.

Although various soldering materials can be used as materials for soldering, a soldering material having high stress resistance is preferably used because the soldering portions in the present invention are exposed to high thermal stress. In addition, when a plurality of soldering portions are present, these portions may be sequentially and independently soldered or may be collectively soldered.

As is obvious, when these portions are to be sequentially and independently soldered, the melting point must be sequentially lowered in the soldering order.

Figure 6:
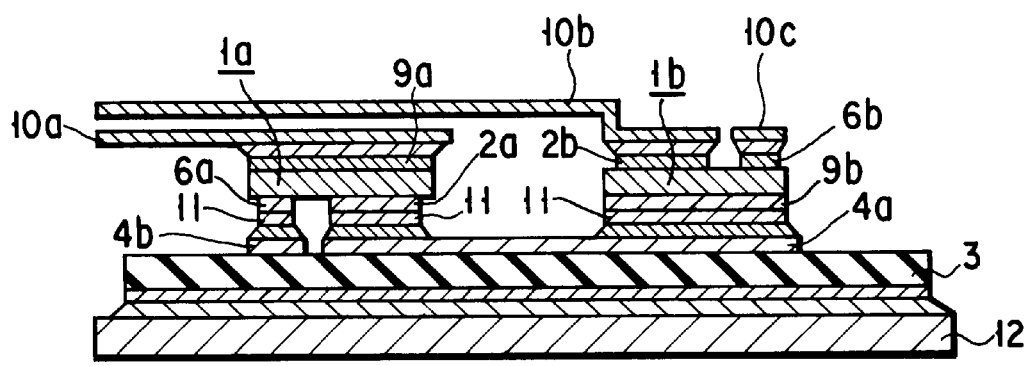
FIG. 6 is a sectional view showing the structure obtained by using a buffer plate for the embodiment shown in FIG. 5.

In addition, the electrodes 2a, 2b, 6a, 6b, 9a, and 9b of the IGBTs 1a and 1b may be soldered to the DBC board 3 through a buffer plate 11 shown in FIG. 6. In this case, the thermal stress produced by the heat generated by the IGBTs 1a and 1b is reduced by the buffer plate 11. This suppresses the fatigue of the solder on the IGBTs 1a and 1b and the soldering portions, and can improve reliability in terms of joint service life.

As a material for the buffer plate, a material having a thermal expansion coefficient near that of silicon as a base material for the IGB's 1a and 1b is preferably used. For example, a single metal such as molybdenum or tungsten, an alloy such as copper-tungsten or 42 alloy, or a clad material such as copper-invar-copper can be used.

Although not shown in this case, a plastic envelope is prepared around the heat sink, and the upper surfaces of the IGBTs 1a and 1b and the DBC board 3 are sealed with silicon gel or the like to be insulated.

The upper surfaces of the IGBTs 1a and 1b and the DBC board 3 are sealed with silicon gel or the like to be insulated. Note that when a GTO is used as a semiconductor switching element, the resultant mounting structure remains the same except that the emitter and collector electrodes are regarded as positive (anode) and negative (cathode) electrodes, respectively.

Figure 7:
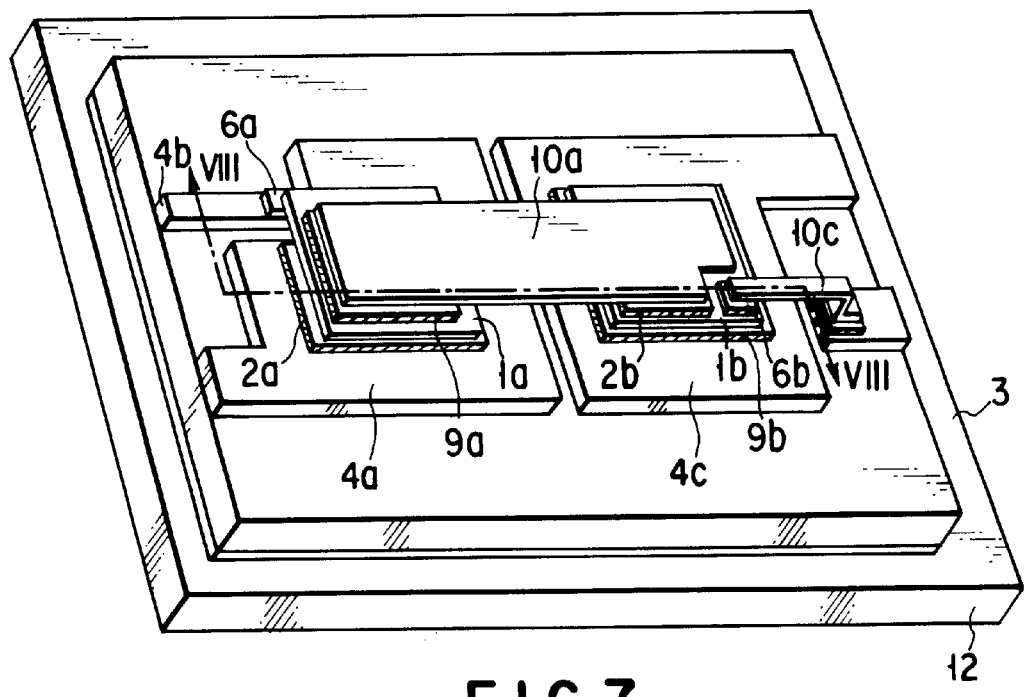
FIG. 7 is a perspective view showing a semiconductor device according to still another embodiment of the present invention.
Figure 8:
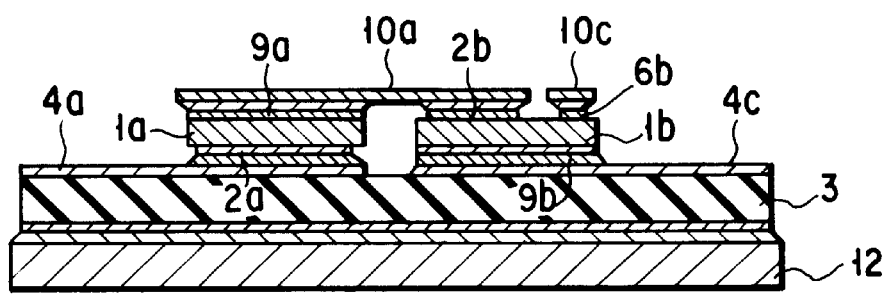
FIG. 8 is a sectional view taken along a line VIII—VIII of the semiconductor device in FIG. 7.

The third embodiment of the present invention will be described next with reference to FIGS. 7 and 8.

The third embodiment is the same as the first embodiment in that first and second IGBTs 1a and 1b are mounted on the lands of a DBC (copper-clad ceramic) board 3 in opposite directions. The same reference numerals in the third embodiment denote the same parts as in the first embodiment, and only a different mounting structure portion will be described.

Lands 4a and 4c are formed on the board 3 in correspondence with the first and second IGBTs 1a and 1b. A single wiring 10a is commonly connected to a collector electrode 9a formed on the upper surface of the first IGBT 1a and an emitter electrode 2b formed on the upper surface of the second IGBT 1b.

In this mounting structure of the third embodiment, therefore, any connection members having components perpendicular to the board 3 need not be used. This can prevent increases in wiring inductance and wiring resistance due to wirings perpendicular to the board 3.

In addition, since the wirings 10a and 10d used in the prior art need not be arranged between the two IGBTs 1a and 1b as semiconductor switching elements, the distance between the semiconductor switching elements can be reduced. This makes the mounting structure more compact.

Various changes and modifications of the above embodiments can be made within the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device for power electronics comprising:

a board made of a ceramic material having a first main surface and a second main surface;

a wiring pattern provided on the first main surface of the board;

a heat sink soldered on the second main surface so that the heat sink is thermally coupled to the board;

a first semiconductor switching element having a first gate electrode and a first emitter electrode formed on one surface of the first semiconductor switching element and a first collector electrode formed on the other surface of the first semiconductor switching element, wherein the first emitter electrode is electrically connected to the wiring pattern; and a first flat wiring structure formed by weaving thin conductive wires, the first flat wiling structure having one end electrically connected to the first collector electrode by soldering.

2. A semiconductor device for power electronics according to claim 1, wherein the first flat wiring structure has the other end soldered to the wiring pattern.

3. A semiconductor device for power electronics according to claim 1, further comprising a second semiconductor switching element having a second collector electrode soldered to the wiring pattern, a second gate electrode and a second emitter electrode to which one end of a second flat wiring structure formed by weaving thin conducting wires is soldered.

4. A semiconductor device for power electronics according to claim 3, wherein at least one of the first and second semiconductor switching elements is an IGBT.

5. A semiconductor device for power electronics according to claim 3, wherein at least one of the first and second semiconductor switching elements is an IEGT.

6. A semiconductor device for power electronics comprising:

a board made of a ceramic material having a first main surface and a second main surface;

a wiring pattern provided on the first main surface of the board;

a heat sink soldered on the second main surface so that the heat sink is thermally coupled to the board;

a semiconductor switching clement having a gate electrode and an emitter electrode formed on one surface of the semiconductor switching element and a collector electrode formed on the other surface of the semiconductor switching element, wherein the emitter electrode is electrically connected to the wiring pattern;

a buffer plate having a thermal expansion coefficient near that of the semiconductor switching element, the buffer plate being provided on at least one of the emitter electrode and gate electrode; and a flat wiring structure formed by weaving thin conductive wires, the flat wiring structure having one end electrically connected to the collector electrode by soldering.

* * * * *